US008810295B2

(12) United States Patent
Koo et al.

(10) Patent No.: US 8,810,295 B2
(45) Date of Patent: Aug. 19, 2014

(54) LATCH CIRCUIT AND FLIP-FLOP CIRCUIT INCLUDING THE SAME

(71) Applicant: SK hynix Inc., Gyeonggi-do (KR)

(72) Inventors: Ja-Beom Koo, Gyeonggi-do (KR); Kang-Youl Lee, Gyeonggi-do (KR); Don-Hyun Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/717,366

(22) Filed: Dec. 17, 2012

(65) Prior Publication Data

US 2013/0307595 A1    Nov. 21, 2013

(30) Foreign Application Priority Data

May 21, 2012 (KR) .......................... 10-2012-0053782

(51) Int. Cl.
*H03K 3/356* (2006.01)
(52) U.S. Cl.
USPC ............ 327/203; 327/208; 327/217; 327/218

(58) Field of Classification Search
USPC ......... 327/199, 202, 203, 208, 210–212, 215, 327/217–219
See application file for complete search history.

(56) References Cited

U.S. PATENT DOCUMENTS

| 6,501,315 B1 * | 12/2002 | Nguyen .......................... 327/217 |
| 6,900,668 B1 * | 5/2005 | Tam et al. ....................... 365/203 |
| 7,975,195 B1 | 7/2011 | Joshi et al. |

* cited by examiner

*Primary Examiner* — Long Nguyen
(74) *Attorney, Agent, or Firm* — IP & T Group LLP

(57) ABSTRACT

A latch circuit may include a first inverting unit configured to drive a second node in response to a level of a first node, a second inverting unit configured to drive the first node in response to a level of the second node, an initialization unit configured to drive the first node at a first level in response to activation of an initialization signal, and a power breaker configured to break a supply of power of a second level to the second inverting unit when the initialization signal is activated.

4 Claims, 5 Drawing Sheets

LATCH CIRCUIT AND FLIP-FLOP CIRCUIT INCLUDING THE SAME

CROSS-REFERENCE TO RELATED APPLICATIONS

The present application claims priority of Korean Patent Application No. 10-2012-0053782, filed on May 21, 2012, which is incorporated herein by reference in its entirety.

BACKGROUND

1. Field

Exemplary embodiments of the present invention relate to a latch circuit storing a signal or a data, and more particularly, to a technology for improving an initialization operation of a latch circuit.

2. Description of the Related Art

A latch circuit, which is a circuit storing a signal or a data has been commonly used for integrated circuits.

FIG. 1 is a circuit diagram illustrating a latch circuit in accordance with the related art.

Referring to FIG. 1, the latch circuit includes two inverters I11 and I12 of which the input/output terminals are interconnected and an initialization unit 110.

When a 'high' level signal is applied to an input node IN, the inverter I11 drives an output node OUT at a 'low' level and the inverter I12 drives the input node IN at a 'high' level in response to a level of the output node OUT. Further, when a 'low' level signal is applied to the input node IN, the inverter I11 drives the output node OUT at a 'high' level and the inverter I12 drives the input node IN at a 'low' level in response to the level of the output node OUT. The inverters I11 and I12 continue to hold and store the level of the signal (data) input to the input node IN according to the principle.

The initialization unit 110 drives the input node IN at a 'low' level when the initialization signal INITIAL is activated to initialize a value stored in the input node IN of the latch to a 'low' level.

When the input node is activated at a 'low' level by the initialization signal INITIAL under the situation in which the 'high' level data is stored in the input node IN of the latch and the 'low' level data is stored in the output node OUT, a conflict that the inverter I12 drives the input node IN at a 'high' level and the initialization unit 110 drives the input node IN at a 'low' level occurs. The conflict causes concerns in that it may become difficult to perform the initialization of the latch, and a current path through a pull up element (generally, PMOS transistor) in the inverter I12 and the initialization unit 110 is formed to consume a large amount of current.

SUMMARY

Exemplary embodiments of the present invention are directed to ensure a stable initialization operation of a latch circuit.

In accordance with an embodiment of the present invention, a latch circuit may include a first inverting unit configured to drive output second node in response to a level of a first node, a second inverting unit configured to drive the first node in response to a level of the second node, an initialization unit configured to drive the first node at a first level in response to activation of an initialization signal, and a power breaker configured to break a supply of power of a second level to the second inverting unit when the initialization signal is activated.

In accordance with another embodiment of the present invention, a latch circuit may include a pass gate configured to transfer a signal of an input node to a first node in response to a clock, a first inverting unit configured to drive an output node in response to a level of the first node, a second inverting unit configured to drive the first node in response to a level of the output node, an initialization unit configured to drive the first node at a first level in response to activation of an initialization signal, and a power breaker configured to break a supply of power of a second level to the second inverting unit when the initialization signal is activated.

In accordance with still another embodiment of the present invention, a flip-flop circuit may include a first pass gate configured to transfer a signal of an input node to a first node in response to a clock, a first inverting unit configured to drive a second node in response to a level of a first node, a second inverting unit configured to drive the first node in response to a level of a second node, an initialization unit configured to drive the first node at a first level in response to activation of an initialization signal a first power breaker configured to break a supply of power of a second level to the second inverting unit when the initialization signal is activated, a second pass gate configured to transfer a signal of the second node to a third node in response to the clock and to be turned off when the first pass gate is turned on and turned on when the first pass gate is turned off, a third inverting unit configured to drive an output node in response to a level of the third node, a fourth inverting unit configured to drive the third node in response to a level of the output node, a second initialization unit configured to drive the third node at a second level in response to the activation of the initialization signal, and a second power breaker configured to break the supply of power of the first level to the fourth inverting unit when the initialization signal is activated.

DETAILED DESCRIPTION

Figure 1:
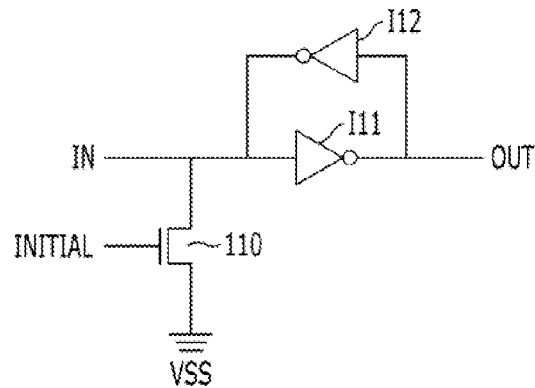
FIG. 1 is a circuit diagram illustrating a latch circuit in accordance with the related art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In this specification, 'connected/coupled' represents that one component is directly coupled to another component or indirectly coupled through another component. In addition, a singular form may include a plural form as long as it is not specifically mentioned in a sentence.

Figure 2:
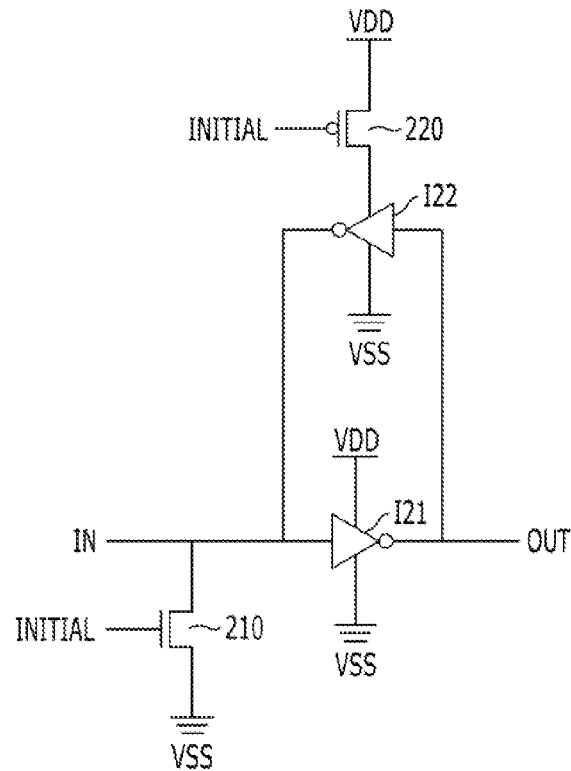
FIG. 2 is a circuit diagram illustrating a latch circuit in accordance with a first embodiment of the present invention.

FIG. 2 is a circuit diagram of a latch circuit in accordance with a first embodiment of the present invention.

Referring to FIG. 2, a latch circuit may include a first inverting unit I21 for driving an output node OUT in response to a level of an input node IN, a second inverting unit I22 for driving an input node IN in response to a level of an output node OUT, an initialization unit 210 for driving the input node at a low level in response to activation of an initialization signal INITIAL, and a power breaker 220 for breaking a supply of 'high'-level power VDD to the second inverting unit I22 when the initialization signal INITIAL is activated.

The first inverting unit I21 drives the output node OUT at a level inverted from that of the input node IN in response to the level of the input node IN. The first inverting unit I21 may also be configured with the inverter as illustrated in FIG. 2 and may also be configured with a NAND gate or a NOR gate that is configured to perform a function of the inverter. When the first inverting unit I21 is configured of the NAND gate, the first inverting unit I21 may be configured so that the signal of the input node IN is input to one of two input terminals of the NAND gate and the power supply voltage VDD is supplied to the other thereof. When the first inverting unit I21 is configured of the NOR gate, the first inverting unit I21 may be configured so that the signal of the input node IN is input to one of two input terminals of the NOR gate and ground voltage VSS is supplied to the other thereof. The high-level power VDD and the low-level power VSS are supplied to the first inverting unit I21 during the operation of the latch circuit. The supply of power to the first inverting unit I21 may be continuous.

The second inverting unit I22 drives the input node IN at a level inverted from that of the output node OUT in response to the level of the output node OUT. The second inverting unit I22 may be configured with the inverter as illustrated in FIG. 2 and may be configured with a NAND gate or a NOR gate that is configured to perform a function of the inverter. The low-level power VSS is continuously supplied to the second inverting unit I22 during the operation of the latch circuit, but the supply of the high-level power VDD to the second inverting unit I22 is controlled by the power breaker 220.

The initialization unit 210 initializes the level of the input node IN at a low level when the initialization signal INITIAL is activated.

The power breaker 220 breaks the supply of high-level power VDD to the second inverting unit I22 when the initialization signal INITIAL is activated, that is, the initialization operation of the initialization unit 210. When the supply of the high-level power VDD to the second inverting unit I22 is stopped, the second inverting unit I22 does not drive the input node IN at a high level even in the case in which the level of the output node OUT is a low level. Therefore, a conflict that the initialization unit 210 drives the input node IN at different levels during the initialization operation of the initialization unit 210 may be prevented.

Figure 3:
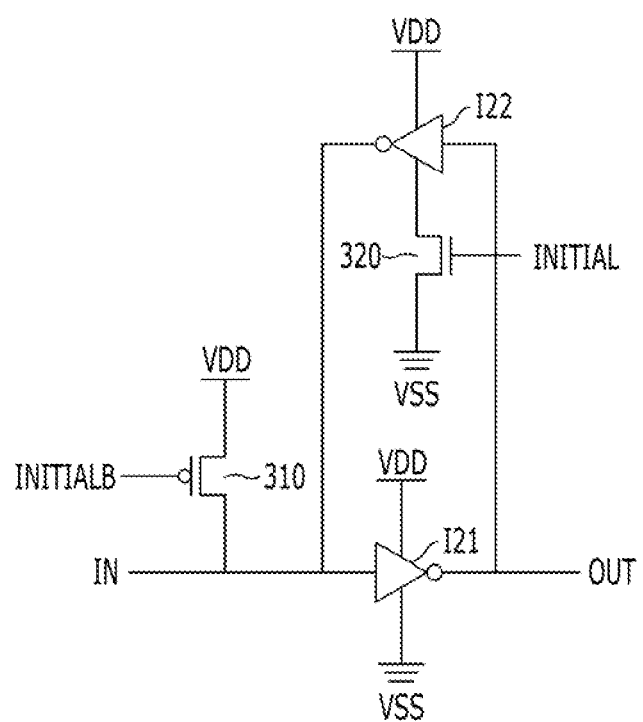
FIG. 3 is a circuit diagram illustrating a latch circuit in accordance with a second embodiment of the present invention.

FIG. 3 is a circuit diagram illustrating a latch circuit in accordance with a second embodiment of the present invention.

Referring to FIG. 3, a latch circuit may include the first inverting unit I21 for driving the output node OUT in response to the level of the input node IN, the second inverting unit I22 for driving the input node IN in response to the level of the output node OUT, an initialization unit 310 for driving the input node at a 'high' level in response to the activation of the initialization signal INITIAL, and a power breaker 320 for breaking the supply of 'low'-level power VSS to the second inverting unit I22 when the initialization signal INITIAL is activated.

The latch circuit of FIG. 3 is the same as the latch circuit of FIG. 2 except that the initialization unit 310 initializes the input node IN to a 'high' level when the initialization signal INITIAL is activated and the power breaker 320 breaks the supply of 'low'-level power VSS input to the second inverting unit I22 when the initialization signal INITIAL is activated and therefore, the description thereof will be omitted herein.

For reference, INITIALB of FIG. 3 represents a signal inverting the INITIAL.

Figure 4:
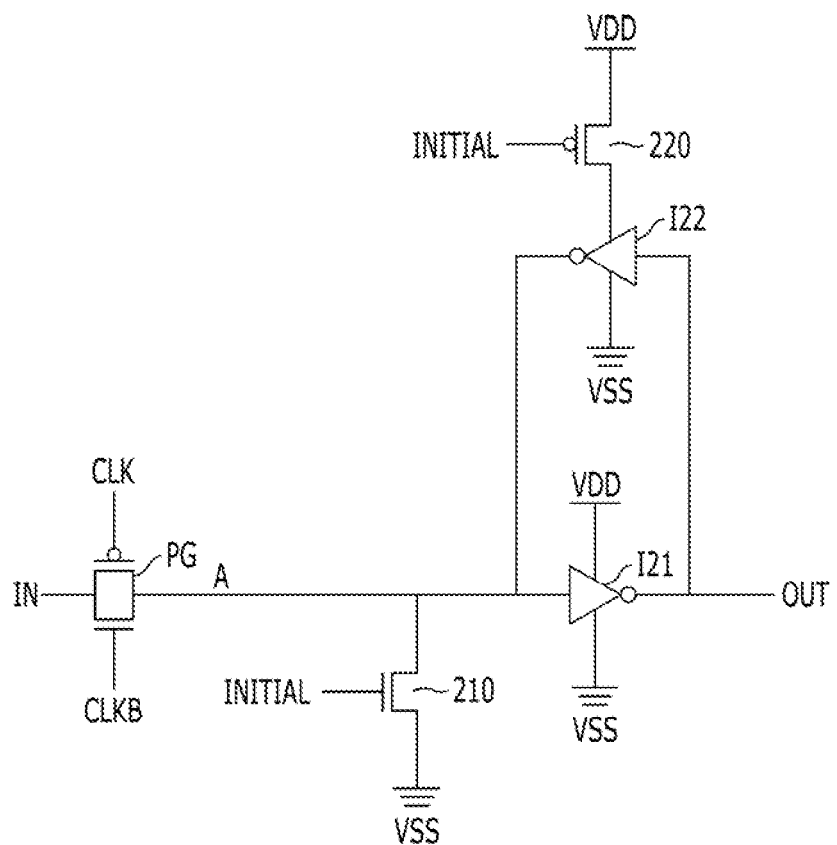
FIG. 4 is a circuit diagram illustrating a latch circuit in accordance with a third embodiment of the present invention.

FIG. 4 is a circuit diagram illustrating a latch circuit in accordance with a third embodiment of the present invention.

Referring to FIG. 4, a latch circuit may include a pass gate (PG) for transferring the signal of the input node IN to a first node A in response to a clock CLK, the first inverting unit I21 for driving the output node OUT in response to a level of a first node A, the second inverting unit I22 for driving the first node A in response to the level of the output node OUT, the initialization unit 210 for driving the first node A at a 'low' level in response to the activation of the initialization signal INITIAL, and the power breaker 220 for breaking the supply of 'high'-level power VDD to the second inverting unit I22 when the initialization signal INITIAL is activated.

The latch circuit of FIG. 4 has a configuration in which a pass gate PG is added to the latch circuit of FIG. 2. The pass gate PG may control an operation by allowing the input signal IN to be input to the latch circuit only when the clock CLK is activated. As such, the latch circuit of which the input terminal IN is provided with the pass gate PG is referred to as a D-latch.

The initialization unit 210 and the power breaker 220 of FIG. 4 may be replaced by the initialization unit 310 and the power breaker 320 having the configuration as illustrated in FIG. 3.

For reference, the CLKB of FIG. 4 represents a signal inverting the clock CLK.

Figure 5:
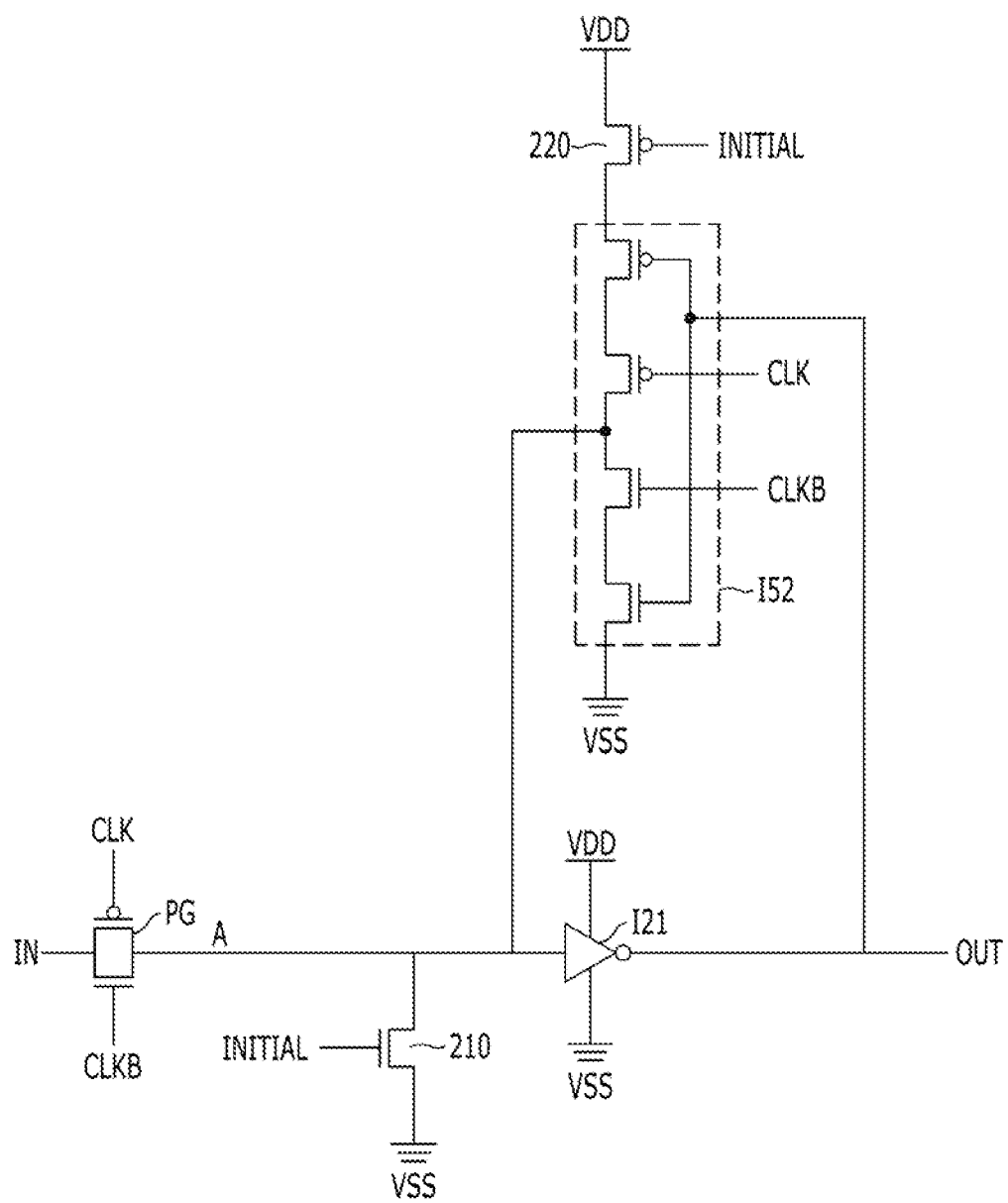
FIG. 5 is a circuit diagram illustrating a latch circuit in accordance with a fourth embodiment of the present invention.

FIG. 5 is a circuit diagram illustrating a latch circuit in accordance with a fourth embodiment of the present invention.

A latch circuit of FIG. 5 is different from the latch circuit of FIG. 4 in terms of a configuration of a second inverting unit I52. As illustrated in FIG. 5, the second inverting unit I52 is configured of a tri-state inverter. The tri-state inverter I52 may be disabled when the clock CLK is activated.

That is, the tri-state inverter I52 is disabled in a period in which the pass gate PG is turned on to input the input signal IN, such that the first node A is not driven at any level and the supply of 'high'-level power VDD is broken by the power breaker 220 in a period in which the initialization signal INITIAL is activated, so that the first node A is not driven at a high level.

The initialization unit 210 and the power breaker 220 of FIG. 5 may also be replaced by the initialization unit 310 and the power breaker 320 having the configuration as illustrated in FIG. 3.

Figure 6:
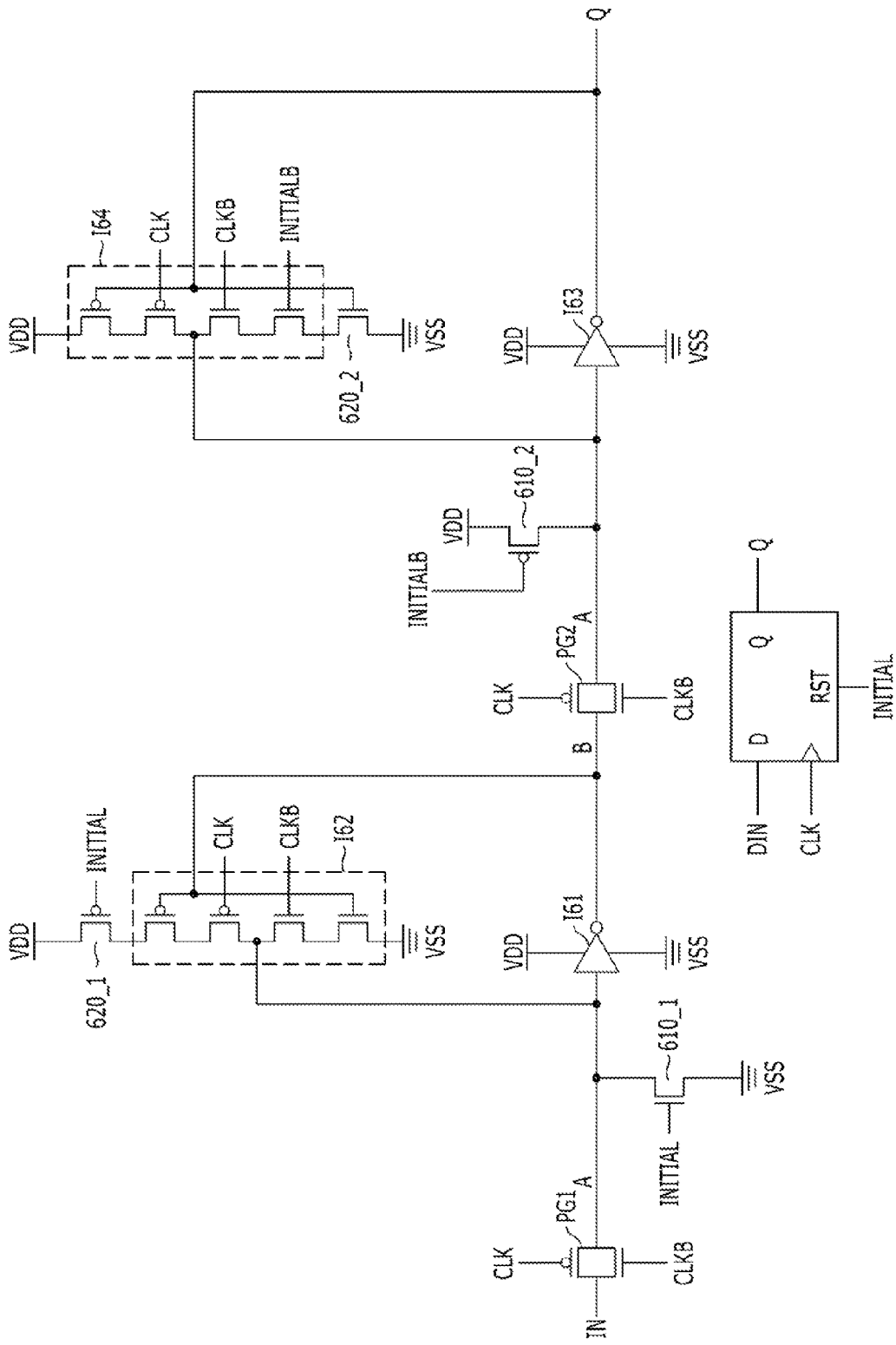
FIG. 6 is a circuit diagram illustrating a flip-flop circuit in accordance with the embodiment of the present invention.

FIG. 6 is a configuration diagram of a flip-flop circuit in accordance with the embodiment of the present invention.

Referring to FIG. 6, the flip-flop circuit may include a first pass gate PG1 for transferring a signal of an input node DIN to the first node A in response to the clock CLK, a first inverting unit I61 for driving a second node B in response to a level of the first node A, a second inverting unit I62 for driving the first node A in response to a level of the second node B, a first initialization unit 610_1 for driving the first node A at a low level in response to the activation of the initialization signal INITIAL, a first power breaker 620_1 for breaking the supply of 'high'-level power VDD to the second inverting unit I62 when the initialization signal INITIAL is activated, a second pass gate PG2, which is turned off when the first pass gate PG1 is turned on and turned on when the first pass gate PG1 is turned off, for transferring a signal of the second node B to a third node C in response to the clock CLK, a third inverting unit I63 for driving an output node Q in response to a level of the output node Q, a second initialization unit 610_2 for driving the third node C at a 'high' level in response to the activation of the initialization signal INITIAL, and a second power breaker 620_2 for breaking the supply of 'low'-level power VSS to a fourth inverting unit I64 when the initialization signal INITIAL is activated.

The flip-flop circuit is a circuit having a form in which two latches having a configuration as illustrated in FIG. 4 or 5 are connected in series. The first pass gate PG1 is turned on in a period in which the clock CLK is 'low'. In this case, the signal of the input node DIN is input to the first node A and is stored by the first inverting unit I61 and the second inverting unit I62. Further, the second pass gate PG2 is turned on in a period in which the clock CLK is 'high'. In this case, the signal of the second node B is stored by the third inverting unit I63 and the fourth inverting unit I64.

The first node A is initialized to the 'low' level by the first initialization unit 610_1 when the initialization signal INITIAL is activated. In this case, the supply of 'high'-level power VDD to the second inverting unit I62 is broken by the first power breaker 620_1 to prevent the conflict. Further, the third node C is initialized to the 'high' level by the first initialization unit 610_2 when the initialization signal INITIAL is activated. In this case, the supply of 'low'-level power VDD to the fourth inverting unit I64 is broken by the second power breaker 620_2 to prevent the conflict.

FIG. 6 illustrates, by way of an example, the tri-state inverter inactivated in a period in which the clock CLK is 'low' and illustrates, by way of example, the tri-state inverter inactivated in a period in which the clock CLK is 'high', but the second inverting unit I62 and the fourth inverting unit I64 may be configured of a general inverter. Further, the tri-state inverter may be designed so that the first pass gate PG1 is turned on in a period in which the clock CLK is 'high' and the second pass gate PG2 is turned on in a period in which the clock CLK is 'low'.

A lower portion of FIG. 6 represents a symbol of the flip-flop circuit.

In accordance with the embodiments of the present invention, the conflict of the latch may be prevented from occurring during the process of initializing the signal (data) stored in the latch.

Although the spirit of the present invention was described in detail with reference to the preferred embodiments, it should be understood that the preferred embodiments are provided to explain, but do not limit the spirit of the present invention. It will be apparent to those skilled in the art that various changes and modifications may be made without departing from the spirit and scope of the invention as defined in the following claims.

What is claimed is:

1. A latch circuit, comprising:
    a pass gate configured to transfer a signal of an input node to a first node in response to a clock;
    a first inverting unit configured to drive an output node in response to a level of the first node;
    a second inverting unit configured to drive the first node in response to a level of the output node;
    an initialization unit configured to drive the first node at a first level in response to activation of an initialization signal; and
    a power breaker configured to break a supply of power of a second level to the second inverting unit when the initialization signal is activated.

2. The latch circuit of claim 1, wherein the second inverting unit includes a tri-state inverter configured to drive the first node in response to the level of the output node and to be activated or inactivated in response to the clock.

3. A flip-flop circuit, comprising:
    a first pass gate configured to transfer a signal of an input node to a first node in response to a clock;
    a first inverting unit configured to drive a second node in response to a level of a first node;
    a second inverting unit configured to drive the first node in response to a level of a second node;
    an initialization unit configured to drive the first node at a first level in response to activation of an initialization signal;
    a first power breaker configured to break a supply of power of a second level to the second inverting unit when the initialization signal is activated;
    a second pass gate configured to transfer a signal of the second node to a third node in response to the clock and to be turned off when the first pass gate is turned on and turned on when the first pass gate is turned off;
    a third inverting unit configured to drive an output node in response to a level of the third node;
    a fourth inverting unit configured to drive the third node in response to a level of the output node;
    a second initialization unit configured to drive the third node at a second level in response to the activation of the initialization signal; and
    a second power breaker configured to break the supply of power of the first level to the fourth inverting unit when the initialization signal is activated.

4. The flip-flop circuit of claim 3, wherein the first inverting unit and the third inverting unit include an inverter, respectively, and
    the second inverting unit and the fourth inverting unit respectively include a tri-state inverter configured to be activated or inactivated in response to the clock.

* * * * *